United States Patent [19]

Hasegawa

[11] 4,116,687

[45] Sep. 26, 1978

[54] GLASSY SUPERCONDUCTING METAL ALLOYS IN THE BERYLLIUM-NIOBIUM-ZIRCONIUM SYSTEM

[75] Inventor: Ryusuke Hasegawa, Morristown, N.J.

[73] Assignee: Allied Chemical Corporation, Morristown, N.J.

[21] Appl. No.: 822,019

[22] Filed: Aug. 5, 1977

Related U.S. Application Data

[63] Continuation-in-part of Ser. No. 749,953, Dec. 13, 1976, abandoned.

[51] Int. Cl.$^2$ ............................ C22C 1/00; C22C 14/00
[52] U.S. Cl. .............................. 75/177; 75/150; 75/174
[58] Field of Search ................. 75/177, 174, 122, 150

[56] References Cited

U.S. PATENT DOCUMENTS

| | | | |
|---|---|---|---|
| 3,856,513 | 12/1974 | Chen et al. | 75/122 |
| 3,989,517 | 11/1976 | Tanner et al. | 75/175.5 |
| 4,050,931 | 9/1977 | Tanner et al. | 75/175.5 |

OTHER PUBLICATIONS

M. M. Collver et al, "Superconductivity in Amorphous Transition Metal Alloys," Phys. Rev. Lett. 30 (1973) 92.
B. W. Roberts, "Survey of Superconductive Materials - - - ," J. Phys. Chem. Ref. Data vol. 5 (1976) pp. 614-618.

*Primary Examiner*—R. Dean
*Assistant Examiner*—Upendra Roy
*Attorney, Agent, or Firm*—David W. Collins; Gerhard H. Fuchs

[57] ABSTRACT

Ductile metal alloys of compositions in the Be-Nb-Zr system are provided. The compositions consist essentially of about 20 to 45 atom percent beryllium, about 2.5 to 20 atom percent niobium and the balance essentially zirconium and incidental impurities. The alloys of the invention, which are suitable for superconducting applications, evidence a combination of critical temperatures of at least about 2 K, critical currents of about $10^3$ A/cm$^2$ and critical fields of about 20 to 60 kOe.

7 Claims, 2 Drawing Figures

GLASSY SUPERCONDUCTING METAL ALLOYS IN THE BERYLLIUM-NIOBIUM-ZIRCONIUM SYSTEM

CROSS-REFERENCE TO RELATED APPLICATION

This is a continuation-in-part application of Ser. No. 749,953, filed Dec. 13, 1976, and now abandoned.

BACKGROUND OF THE INVENTION

1. Field of the Invention

This invention relates to superconducting alloys, and more particularly, to superconducting metal alloys in the beryllium-niobium-zirconium system comprising a glassy matrix in which superconducting species are supported.

2. Description of the Prior Art

In the past, various ductile superconducting wires made from Nb-Ti, Nb-Zr and Nb-Ti-Zr (with superconducting transition temperature $T_c$ about 10 K) and other ductile superconductors have been considered for constructing superconducting magnets, motors and generators. However, these ductile wires have had relatively low critical fields and low stability against high magnetic fields due to their poor thermal conductivity. To overcome this problem, these wires have been imbedded in a normal resistance matrix such as copper. However, such combinations have usually lacked sufficient physical strength to achieve high stability of performance in magnetic fields.

Novel glassy metal alloys in wire form have been disclosed by H. S. Chen and D. E. Polk in U.S. Pat. No. 3,856,513, issued Dec. 24, 1974. These glassy metal alloys are represented by the formula $T_iX_j$, where T is at least one transition metal, X is at least one element selected from the group consisting of aluminum, antimony, beryllium, boron, germanium, carbon, indium, phosphorus, silicon and tin, "i" ranges from about 70 to 87 atom percent and "j" ranges from about 13 to 30 atom percent. However, no superconducting compositions are disclosed therein.

Such glassy metal alloys, like oxide glasses rapidly quenched from the melt, lack any long range order and evidence X-ray diffraction patterns in which intensity varies slowly with diffraction angle. This is in contrast to crystalline materials, which possess long range order and evidence a rapidly changing intensity with diffraction angle.

Although a relatively high superconducting transition temperature $T_c$ of about 10 K has been observed in the prior art for disordered beryllium thin films, vapor-deposited amorphous or highly disordered films have not been demonstrated to be of practical use due to their thickness limitation (less than about 1000 Å) and their thermal instability. Various attempts have been made to synthesize non-crystalline, or glassy, superconducting alloys because such alloys are generally ductile, which is not the case for many of the crystalline superconductors having high $T_c$ values. Some examples of these efforts include $Pd_{35}Zr_{65}$ ($T_c=3.5$ K) $Au_{24}La_{76}$ ($T_c=3.3$ K) and $Rh_{20}Zr_{80}$ ($T_c=4.1$ K).

SUMMARY OF THE INVENTION

In accordance with the invention, ductile metal alloys are provided which consist essentially of about 20 to 45 atom percent beryllium, about 2.5 to 20 atom percent niobium and the balance essentially zirconium and incidental impurities. The metal alloys of the invention are superconducting and evidence superconducting transition temperatures of at least about 2 K, critical currents of about $10^3$ A/cm$^2$ and critical fields of about 20 to 60 kOe.

The metal alloys of the invention are formed by cooling a melt of the desired composition at a rate of at least about $10^{5°}$ C/-sec, employing well-known rapid quenching techniques. At such quench rates, when the amount of niobium is less than about 15 atom percent, the alloys are primarily glassy. Alloys of Be-Nb-Zr having a higher concentration of niobium comprise a glassy matrix in which are suspended various intermetallic compounds of niobium with beryllium and/or zirconium.

DETAILED DESCRIPTION OF THE INVENTION

Figure 1:
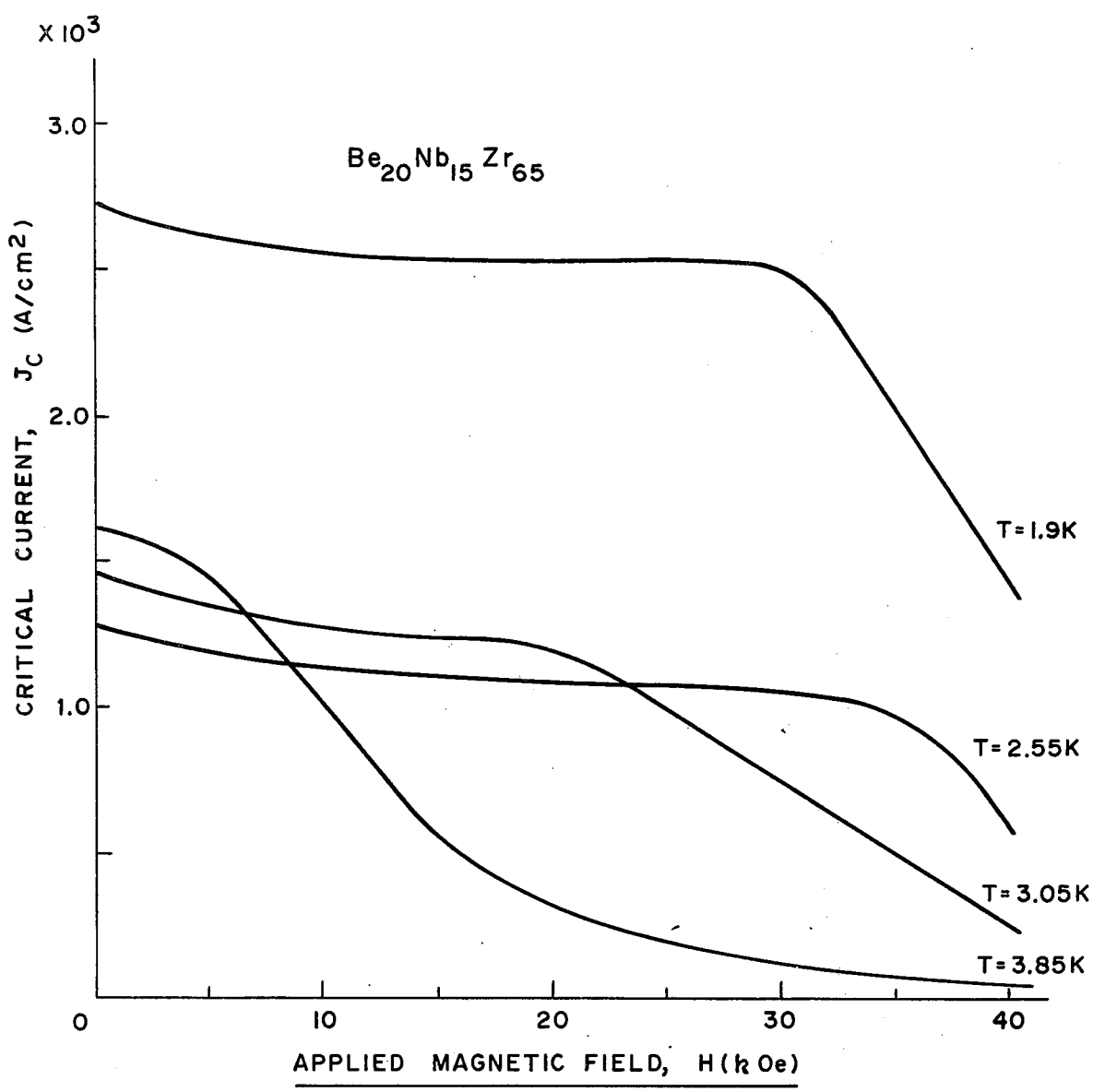
FIG. 1, on coordinates of critical current $J_c$ (in A/cm$^3$) and applied magnetic field H (in kOe), depicts the behavior of the critical current as a function of applied field at various temperatures (in K) for a glassy alloy of the invention having the composition $Be_{20}Nb_{15}Zr_{65}$ (the subscripts are in atom percent)

Superconducting alloys find a variety of potential uses, including magnets and transformers, which take advantage of essentially zero resistance at some critical temperature $T_c$. Superconducting magnets require alloys possessing high critical fields and high critical currents, while superconducting transformers require high critical fields and moderate critical currents.

As is conventional, the critical temperature (superconducting transition temperature) is that temperature at which the potential drop across a specimen 1 cm long is less than $10^{-7}$ V at a current of 0.1 A. This corresponds to an upper-bound electrical resistivity of about $10^{-10}$ ohm-cm. The critical current is that current at which the voltage across the sample exceeds $10^{-7}$ V. The critical field is that field at which the voltage across the sample exceeds $10^{-7}$ V.

Prior art crystalline metal alloy superconductors generally possess a critical field dependence with critical current such that as the field is reduced, the current rises very slowly at first and only at low fields increases rapidly. Prior art crystalline metal alloy superconductors also evidence shifts in critical field as a function of temperature at constant critical current such that the lower the temperature, the higher the critical field is required; such plots evidence a negative slope ($\delta H_c/\delta T < 0$).

In accordance with the invention, ductile metal alloys are provided which consist essentially of about 20 to 45 atom percent beryllium, about 2.5 to 20 atom percent niobium and the balance zirconium and incidental impurities. In weight percent, beryllium ranges from about 2.4 to 7.5%, niobium about 3.1 to 4.3% and the balance essentially zirconium plus incidental impurities. Such metal alloys are superconducting and possess superconducting transition temperatures $T_c$ of at least about 2 K, critical currents $J_c$ of about $10^3$ A/cm$^2$ and critical fields $H_c$ of about 20 to 60 kOe. Outside the foregoing range, either the compositions cannot be easily quenched to form ductile alloys or they do not possess desirable superconducting properties. Examples of superconducting alloys of the invention include $Be_{35}Nb_5Zr_{60}$ and $Be_{20}Nb_{15}Zr_{65}$ (the subscripts are in atom percent).

In addition to the useful properties disclosed above, these alloys are easily fabricable as filaments, i.e., as ribbons and wires, which are highly suited for fabrication as magnets, transformers and the like.

Alloys consisting essentially of about 20 to 35 atom percent beryllium, about 5 to 20 atom percent niobium and the balance essentially zirconium and incidental impurities evidence exceptionally sharp transition widths $\Delta T_c$ of less than about 0.15 K, compared with a typical $\Delta T_c$ of up to about a few degrees for most prior art superconducting compositions. Accordingly, such alloys are preferred.

Alloys consisting essentially of about 20 to 30 atom percent beryllium, about 10 to 20 atom percent niobium and the balance essentially zirconium and incidential impurities evidence superconducting transition temperatures of greater than 3 K, and accordingly, such alloys are most preferred.

The metal alloys of the invention are formed by cooling a melt of the desired composition at a rate of at least about $10^{5°}$ C/sec, employing well-known rapid quenching techniques. The purity of all compositions is that found in a normal commercial practice.

At quench rates of at least about $10^{5°}$ C/sec, the alloys of the invention which contain about 20 to 45 atom percent beryllium, about 5 to 15 atom percent niobium and the balance essentially zirconium are primarily glassy, but may contain a fraction, typically less than about 20 volume percent, of crystalline material. A higher degree of glassiness, approaching substantially total glassiness, results in a higher degree of ductility, and is obtained at somewhat higher quench rates. Such substantially total glassiness accordingly is preferred. At quench rates of about $10^{5°}$ C/sec, alloys in which the amount of beryllium ranges from about 20 to 30 atom percent and the amount of niobium ranges from about 2.5 to 5 atom percent are substantially totally glassy. On the other hand, when the amount of niobium is greater than about 15 atom percent, the alloys of the invention comprise a glassy matrix in which are suspended various intermetallic compounds of niobium with beryllium and/or zirconium.

The superconducting behavior of one alloy of the invention is depicted in FIG. 1, which is a plot at various temperatures (in K) of the dependence of the critical current $J_c$ on the applied magnetic field. The alloy has the composition $Be_{20}Nb_{15}Zr_{65}$. This alloy evidences a critical current $J_c$ of about 1 to 3 × $10^3$ A/cm², a critical field $H_c$ of about 20 to 60 kOe and a transition temperature of 6.85 K. The alloy possesses a critical field dependence with critical current such that at low temperatures, e.g., 1.9 K, the critical current remains substantially constant up to about 30 kOe, then falls off rapidly. This is apparently due to the unique combination of a zirconium-rich crystalline phase embedded in a glassy matrix.

Figure 2:
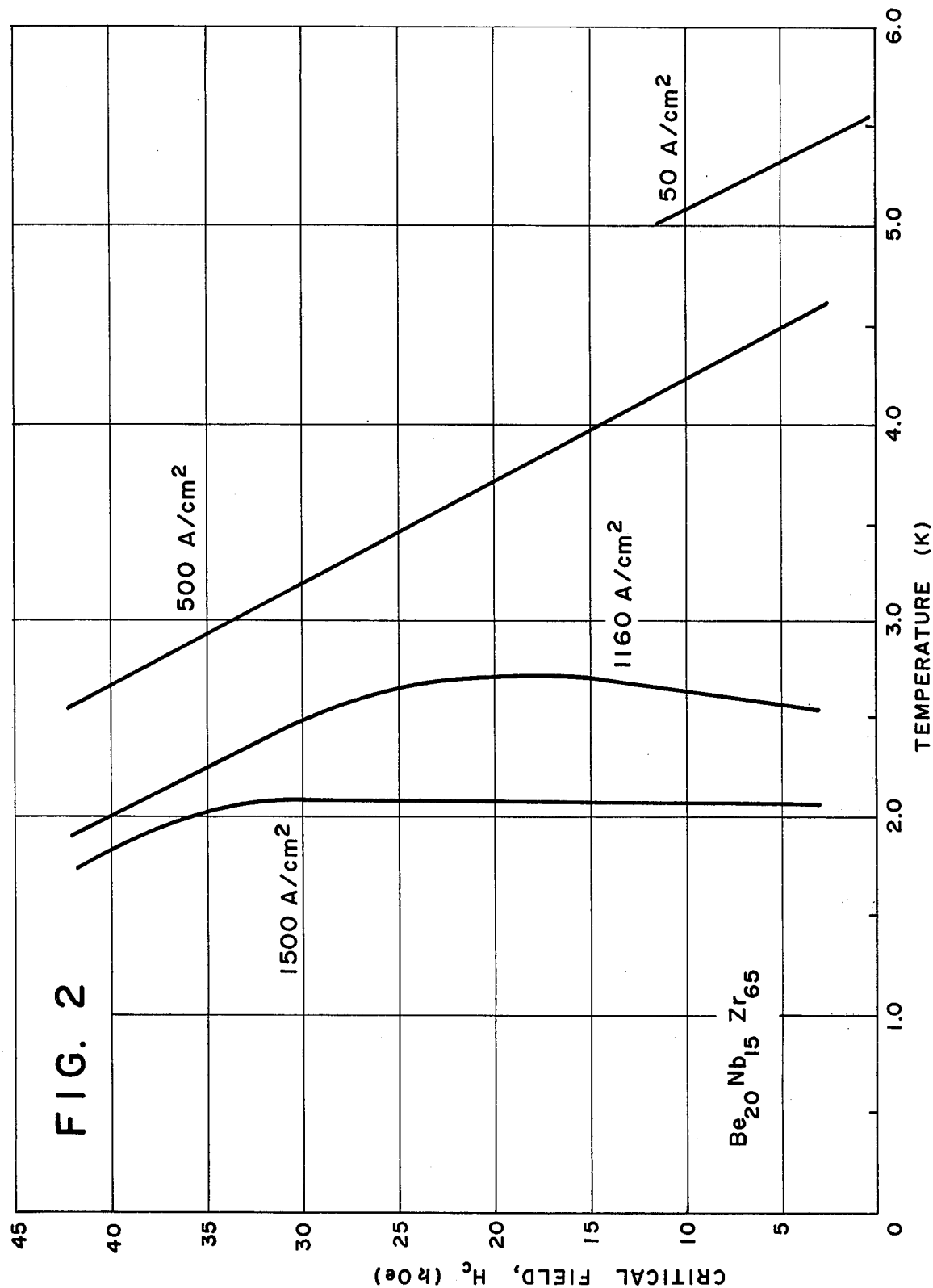
FIG. 2, on coordinates of critical magnetic field (in kOe) and temperature, depicts the behavior of the critical field as a function of temperature at various applied critical currents for $Be_{20}Nb_{15}Zr_{65}$.

The composition $Be_{20}Nb_{15}Zr_{65}$, which is primarily glassy, also evidences a positive dependence of critical field as a function of temperature ($\delta H_c/\delta T > 0$) over a range of various constant critical currents, as depicted in FIG. 2. Specifically, at constant critical currents greater than about 500 A/cm², the value of $\delta H_c/\delta T$ is seen to be positive (e.g., at 1160 A/cm²) and to approach $\infty$ at 1500 A/cm². The effect of a positive value has been predicted for superconducting colloids, consisting of spheres of superconducting material dispersed in a metal matrix; see Vol. 28, *Physical Review Letters*, pp. 222–224 (1972).

A variety of techniques are available, as in now well-known in the art, for fabricating splat-quenched foils and rapidquenched continuous ribbon, wire, sheet, powder etc. Typically a particular composition is selected. Powders or granules of the requisite elements in the desired portions are melted and homogenized, and the molten alloy is rapidly quenched on a chill surface, such as a rapidly rotating cylinder. Due to the highly reactive nature of these compositions, it is preferred that the alloys be fabricated in an inert atmosphere or in a partial vacuum.

EXAMPLES

Ribbons of glassy metal alloys of the invention of about 1 to 2 mm wide and about 30 to 50 μm thick were formed by squirting a melt of the composition by overpressure of argon onto a rapidly rotating copper chill wheel (surface speed about 3000 to 6000 ft/min) in a partial vacuum of absolute pressure of about 200 μm of Hg. Glassiness was determined by X-ray diffraction. A cooling rate of at least about $10^{5°}$ C/sec was obtained. The superconducting transition behavior of several alloys was monitored by measuring the resistivity of the material by a conventional four-probe method. The current used was about 100 μA.

The superconducting transition temperatures $T_c$ for several glassy Be-Nb-Zr alloys are listed in the Table below, together with the room temperature resistivities. The value of $T_c$ was taken as the temperatures at which $\rho_s/\rho_n = 0.5$, where $\rho_s$ and $\rho_n$ are the resistivities in the superconducting and normal states, respectively. The transition width $\Delta T_c$ is defined as the temperature difference between the points at which $\rho_s/\rho_n$ have the values 0.1 and 0.9. The substantially glassy Be-Nb-Zr alloys with less than about 5 atom percent niobium evidenced low superconducting transition temperatures ($T_c$ about 2.6 K), together with $\Delta T_c$ of about 0.02 K. As the niobium content was increased above about 5 atom percent, the value of $T_c$ increased and the transition tended to become somewhat broader than for the substantially glassy alloys, but $\Delta T_c$ was still less than about 0.15 K. The increase of $T_c$ became more pronounced as the niobium content increased above 10 atom percent and as the beryllium content decreased.

High niobium-containing alloys were observed to be comprised of a non-continuous crystalline phase embedded in a glassy matrix. The crystalline phase in $Be_{20}Nb_{15}Zr_{65}$, which comprised about 5 to 8 volume percent of the total material, was in the form of irregularly shaped particles and appeared to be a zirconium-rich binary composition of zirconium and niobium. This alloy also evidenced a high ductility and low density (about 6 g/cm³).

TABLE

Superconducting Properties of Alloys of the Invention

| Composition (Atom Percent) | | | Superconducting Transition Temperature $T_c$ (K) | Transition Temperature Width $\Delta T$ (K) | Room Temperature Resistivity $\rho$ ($\mu\Omega$-cm) |
| --- | --- | --- | --- | --- | --- |
| Be | Nb | Zr | | | |
| 35 | 2.5 | 62.5 | 2.62 | 0.04 | 227 |
| 35 | 5 | 60 | 2.64 | 0.02 | 305 |
| 35 | 7.5 | 57.5 | 3.00 | 0.04 | 231 |
| 35 | 10 | 55 | 3.18 | 0.15 | 234 |
| 30 | 15 | 55 | 3.37 | 0.08 | 196 |
| 30 | 20 | 50 | 3.02 | 0.15 | 224 |
| 25 | 15 | 60 | 3.66 | 0.10 | 190 |
| 20 | 15 | 65 | 6.85 | 0.10 | 209 |

What is claimed is:

1. A metal alloy consisting essentially of about 20 to 45 atom percent beryllium, about 2.5 to 20 atom percent niobium and the balance essentially zirconium and incidental impurities.

2. The metal alloy of claim 1 consisting essentially of about 20 to 35 atom percent beryllium, about 5 to 20 atom percent niobium and the balance essentially zirconium and incidental impurities.

3. The metal alloy of claim 1 in which the alloy consists essentially of about 20 to 45 atom percent beryllium, about 2.5 to 15 atom percent niobium and the balance essentially zirconium and incidental impurities and is primarily glassy.

4. The metal alloy of claim 2 consisting essentially of about 20 to 30 atom percent beryllium, about 10 to 20 atom percent niobium and the balance essentially zirconium and incidental impurities.

5. The metal alloy of claim 4 consisting essentially of about 20 atom percent beryllium, about 15 atom percent niobium and the balance essentially zirconium and incidental impurities.

6. The metal alloy of claim 3 in which the alloy consists essentially of about 20 to 30 atom percent of beryllium, about 2.5 to 5 atom percent niobium and the balance essentially zirconium and incidental impurities.

7. The metal alloy of claim 6 in which the alloy is substantially glassy.

* * * * *